(12) United States Patent
Kempinski

(10) Patent No.: US 7,880,281 B2
(45) Date of Patent: Feb. 1, 2011

(54) SWITCHING ASSEMBLY FOR AN AIRCRAFT IGNITION SYSTEM

(75) Inventor: Steve J. Kempinski, Seneca, SC (US)

(73) Assignee: Champion Aerospace LLC, Liberty, SC (US)

( * ) Notice: Subject to any disclaimer, the term of this patent is extended or adjusted under 35 U.S.C. 154(b) by 13 days.

(21) Appl. No.: 12/194,933

(22) Filed: Aug. 20, 2008

(65) Prior Publication Data

US 2009/0050931 A1 Feb. 26, 2009

Related U.S. Application Data

(60) Provisional application No. 60/956,801, filed on Aug. 20, 2007.

(51) Int. Cl.
*H01L 23/495* (2006.01)
*H01L 23/34* (2006.01)
*H01L 23/498* (2006.01)

(52) U.S. Cl. .................. 257/676; 257/502; 257/723; 257/666; 257/E23.037; 257/E23.043

(58) Field of Classification Search .................. 257/676, 257/502, 666, 723, E23.037, E23.043
See application file for complete search history.

(56) References Cited

U.S. PATENT DOCUMENTS

| | | | |
|---|---|---|---|
| 4,470,063 A | | 9/1984 | Arakawa et al. |
| 5,592,118 A | | 1/1997 | Wilmot et al. |
| 5,661,343 A | * | 8/1997 | Takahashi et al. ........... 257/723 |
| 5,929,519 A | * | 7/1999 | Mori et al. ................... 257/724 |
| 6,297,549 B1 | * | 10/2001 | Hiyoshi ....................... 257/703 |
| 6,589,859 B2 | * | 7/2003 | Petitbon et al. ............. 438/611 |
| 6,770,964 B2 | * | 8/2004 | Hiyoshi ....................... 257/692 |
| 6,841,421 B2 | * | 1/2005 | Aono et al. .................. 438/121 |
| 6,906,410 B2 | * | 6/2005 | Aono et al. .................. 257/691 |
| 6,979,843 B2 | * | 12/2005 | Nakajima et al. ........... 257/182 |
| 2008/0029875 A1 | | 2/2008 | Zhuang et al. |

FOREIGN PATENT DOCUMENTS

| | | |
|---|---|---|
| DE | 330967 A | 9/1984 |
| EP | 0727818 A | 8/1996 |
| JP | 61048947 A | 3/1986 |
| JP | 61148845 A | 7/1986 |

OTHER PUBLICATIONS

UK Search Report under Section 17 for GB0815061.7; Dec. 31, 2008, 2 pages.

* cited by examiner

*Primary Examiner*—Luan C Thai
(74) *Attorney, Agent, or Firm*—Reising Ethington P.C.

(57) ABSTRACT

A switching assembly is disclosed for a high voltage aircraft ignition system. The switching assembly includes a ceramic substrate and switch die that includes an anode bonded to an electrical pad on the ceramic substrate. The switch die includes a semiconductor device having a plurality of interleaved gates and cathodes, and includes a ceramic cap having at least one gate pad connected to the gates and at least one cathode pad connected to the cathodes. The switching assembly includes leads connected to the gate pad, the cathode pad, and the electrical pad on the substrate. The switch die and a portion of the leads are potted to form the completed assembly.

14 Claims, 5 Drawing Sheets

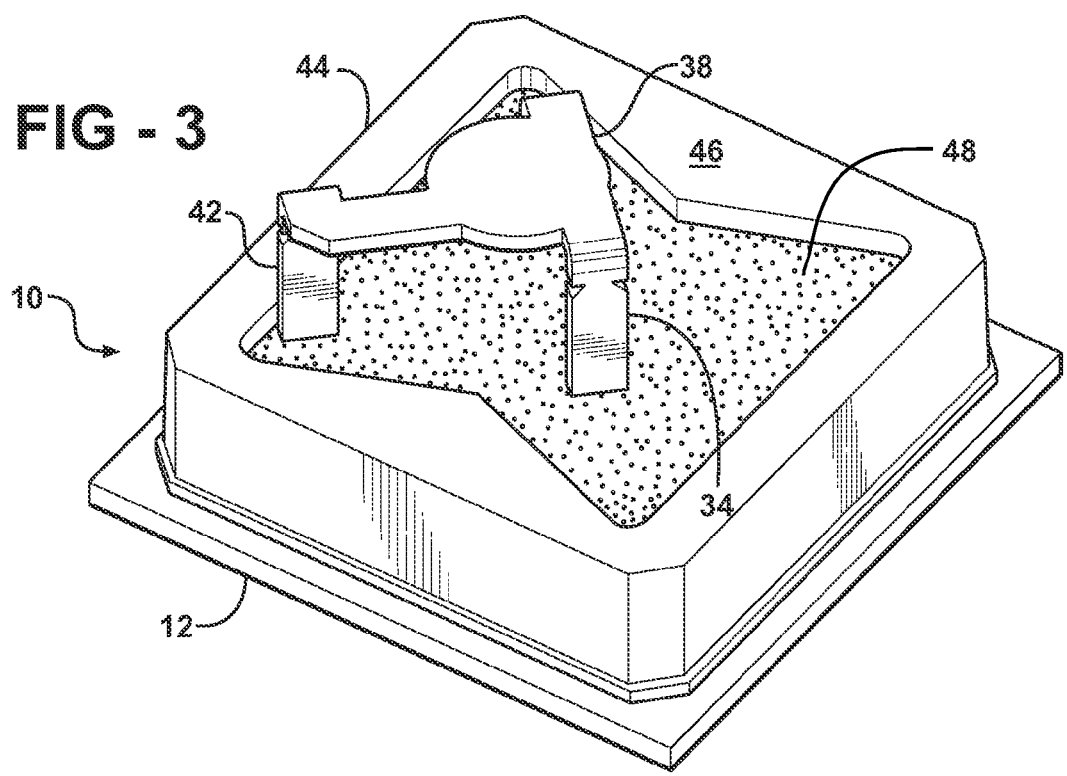
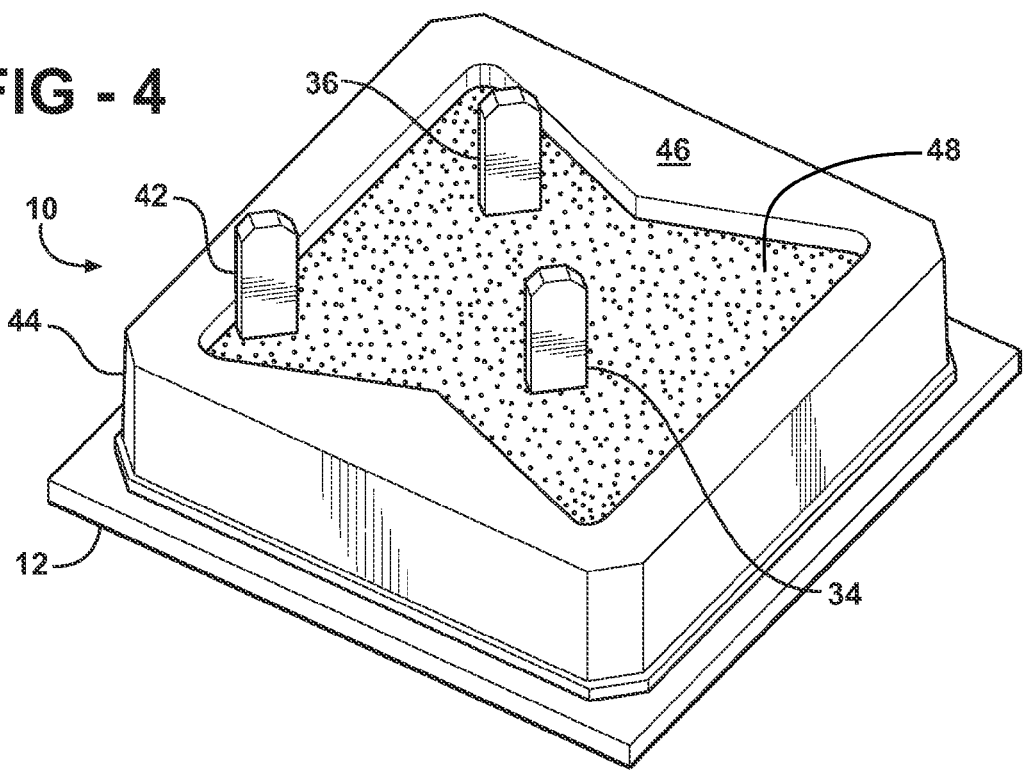

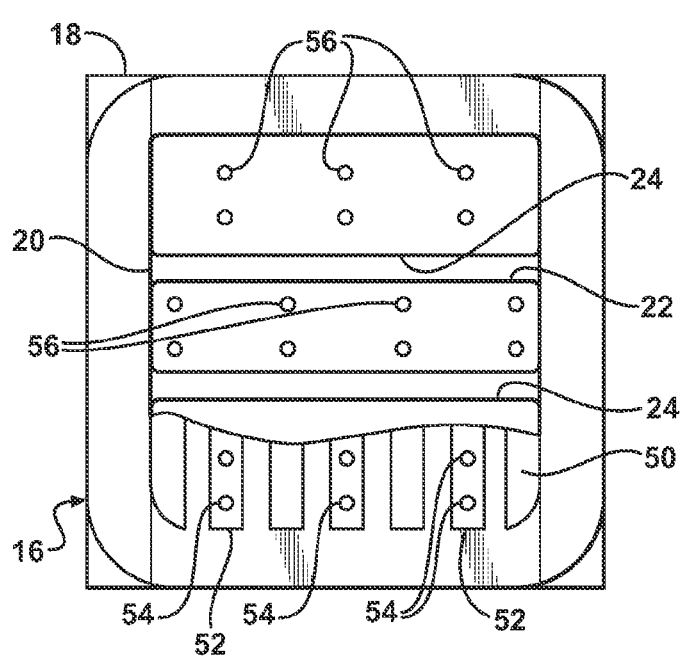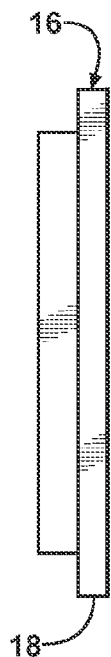
FIG - 5
FIG - 6
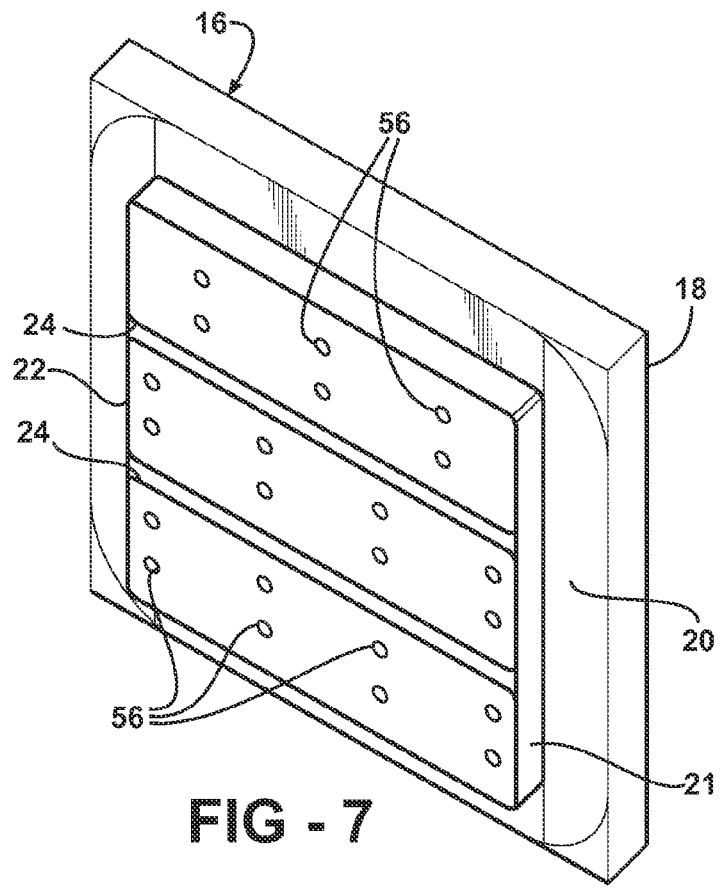
FIG - 7

US 7,880,281 B2

SWITCHING ASSEMBLY FOR AN AIRCRAFT IGNITION SYSTEM

CROSS-REFERENCE TO RELATED APPLICATION

This application claims the priority of U.S. Provisional Application No. 60/956,801, filed Aug. 20, 2007, the entire contents of which are hereby incorporated by reference.

TECHNICAL FIELD

The invention generally relates to switching assemblies. More particularly, the invention relates to switching assemblies used in high voltage circuits such as aircraft ignition systems.

BACKGROUND OF THE INVENTION

Switches used in high voltage circuits are required to be able to maintain the high voltage without current leakage. Therefore, there are physical parameters which must be taken into consideration to maximize the voltage that the switch is able to handle without leaking the current therethrough. In U.S. Pat. No. 5,592,118, a pulse power thyristor (PPT) semiconductor switching device is disclosed that is designed to control current leakage across the edge thereof by mechanically beveling the edge of the switch to control the leakage. The edge of the PPT switch can be beveled by sandblasting or saw cutting and the beveled edge then smoothed by chemical etching. A polyimide film or other dielectric layer is applied to the bevel to reduce surface leakage.

SUMMARY OF THE INVENTION

In accordance with one aspect of the invention, there is provided a switching assembly for a high voltage aircraft ignition system. The switching assembly comprises a substrate supporting an anode pad, a semiconductor device connected to the anode pad, a plurality of leads for electrical connection to the assembly, and a potting covering at least a portion of the semiconductor device and leads. The semiconductor device has a high voltage gate and cathode. The leads include a first lead electrically connected to the high voltage gate, a second lead electrically connected to the cathode, and a third lead electrically connected to the anode pad.

BRIEF DESCRIPTION OF THE DRAWINGS

Preferred exemplary embodiments of the invention will hereinafter be described in conjunction with the appended drawings, wherein like designations denote like elements, and wherein:

FIG. 3 is a perspective view of the switching assembly of FIG. 1 after potting;

FIG. 4 is a perspective view of the completed switching assembly of FIG. 1;

FIG. 5 is a top view, partially cut away, of a switch die used in the switching assembly of FIG. 1;

FIG. 6 is a side view of the switch die;

FIG. 7 is a perspective view of the switch die; and

DETAILED DESCRIPTION OF THE PREFERRED EMBODIMENTS

Figure 1:
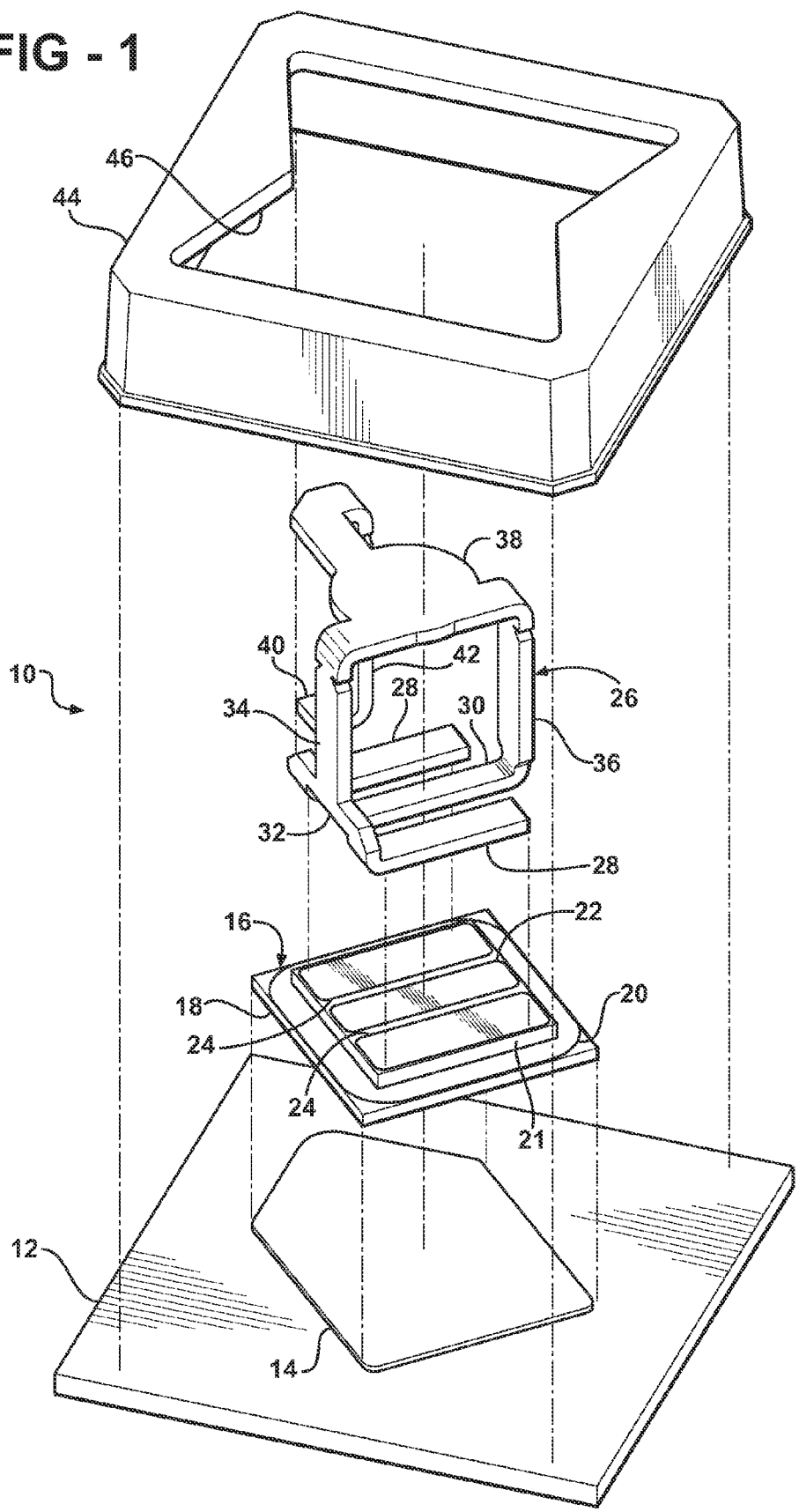
FIG. 1 is an exploded perspective view of one embodiment of a switching assembly constructed in accordance with the invention.

Referring to FIGS. 1 through 4, one embodiment of the switch assembly is generally indicated at 10. The switch assembly is designed to reduce current leakage across the edges thereof. In addition, the switch assembly 10 has been designed such that it may be manufactured using a substantially automated assembly line. The method for fabricating the switching assembly 10 will be discussed in greater detail subsequently.

The switching assembly 10 includes an aluminum nitride ceramic base or substrate 12. The ceramic substrate 12 is shown to be a square in the figures. It should be appreciated by those skilled in the art that the ceramic substrate 12 may define any shape necessary or desirable based on the space parameters into which the switch assembly 10 will be mounted. A copper pad 14 is bounded to the ceramic substrate 12. The copper pad 14 is bonded to the ceramic substrate 12 using conventional methods.

A switch die, generally indicated at 16, is soldered to the copper pad 14. The switch die 16 includes a solderable anode pad 18 which is disposed on the bottom of the switch die 16. The anode pad 18 is soldered to the copper pad 14, which can be done by conventional techniques such as reflow soldering. It may be appreciated by those skilled in the art that the copper pad 14 in some embodiments can act as the anode pad, which would eliminate the need for the separate anode pad 18 on the switch die 16. In the embodiment shown, the switch die 16 principally comprises a semiconductor frame 20, with the anode pad 18 being bonded to the backside of this semiconductor 20. Mounted on top of the semiconductor frame 20 is a ceramic cap 21 that has on its top side a gate pad 22 and two cathode pads 24. The gate pad 22 is disposed in between the two cathode pads 24. All of the pads 22, 24 are parallel to each other.

A lead frame, generally indicated at 26, is soldered to the gate 22 and cathode 24 pads. The lead frame 26 includes pad receiving terminals 28 for each of the cathode pads 24 and a single pad receiving terminal 30 for the gate pad 22. The two pad receiving terminals 28 are connected to each other electrically via a cathode bridge 32. Extending upwardly from the single pad receiving terminal 30 for the gate pad 22 and the cathode bridge 32 are gate 36 and cathode 34 extensions. Distal ends of the extensions 34, 36 are connected by a lead frame spacer 38.

Likewise, a pad receiving terminal 40 is soldered to the anode pad 18. An anode extension 42 extends up from the pad receiving terminal 40 for the anode pad 18 and is eventually connected to the lead frame spacer 38 at the distal end thereof. The pad receiving terminal 40 for the anode pad 18 is actually soldered to the copper pad 14. It should be appreciated by those skilled in the art that, if the anode pad 18 is designed to have a flange extend out beyond the switch die 16, the pad receiving terminal 40 for the anode pad 18 could be soldered directly to the anode pad 18 and not the copper pad 14. It is contemplated that the pad receiving terminals 28, 30, 42, the extensions 34, 36, 42 and the lead frame spacer 38 are all fabricated as a unitary structure.

A potting shell 44 is secured to the ceramic substrate 12 around the entire copper pad 14. A partial cover 46 extends over a portion of the switching assembly 10. The cathode 34, gate 36 and anode 42 extensions extend out beyond the partial cover through an opening defined by the partial cover 46. A potting material 48 is poured into the potting shell 44 and allowed to cure to seal the switching assembly 10 therein. When the potting material 48 is cured within the potting shell 44, only the extensions 34, 36, 42 and lead frame spacer 38 are visible. Subsequent to the curing of the potting material 48, the lead frame spacer 38 is snapped or removed from the extensions 34, 36, 42 to provide independent electrical connections to each of the anode pad 18, gate pad 22 and cathode pad 24.

Referring to FIGS. 5 through 7, the switch die 16 is generally shown. The switch die 16 is shown with the gate pad 22 and the two cathode pads 24 bonded thereto. Within the semiconductor frame 20 are a plurality of gates 50 and a plurality of cathodes 52. The plurality of gates 50 and cathodes 52 are formed within the semiconductor frame 20 during the doping stages thereof. Each of the plurality of cathodes 52 is surrounded by two of the plurality of gates 50. Each of the plurality of cathodes 52 and each of the plurality of gates 50 are disposed adjacent to each other and extend parallel to each other. The plurality of gates 50 and cathodes 52 extend perpendicularly to the gate pad 22 and the two cathode pads 24. Welding points 54 are shown on three of the cathodes 52 that are shown through the cut away portion in FIG. 5. These welding points extend up through the top ceramic layer 21 and are physically connected to the cathode pads 24 at weld points 56. The gates 50 also include welding points 54 that extend upwardly and are physically connected to the gate pad 22. The cathode pad 24 that is not cut away and the gate pad 22 show weld points 56 that represent the points through the semiconductor frame 20 that the pads 22, 24 meet the gates 50 and cathodes 52, respectively.

The switch die 16 is fabricated using a cellular-type structure similar to those being used in MOSFET and IGBT devices. The switch die 16 uses a standard "planar" technology as opposed to deep diffusion, and is manufactured using a junction termination enhancement "JTE" technique that keeps the edge leakage current low and predictable. Switch die 16 with its ceramic cap 21 and gate and cathode pads 22, 24 can be obtained from Silicon Power Corp. of Malvern, Pa., USA (www.siliconpower.com) which produces this component using a JTE switch die obtained from Micrel Inc. of San Jose, Calif., USA (www.micrel.com).

Figure 8:
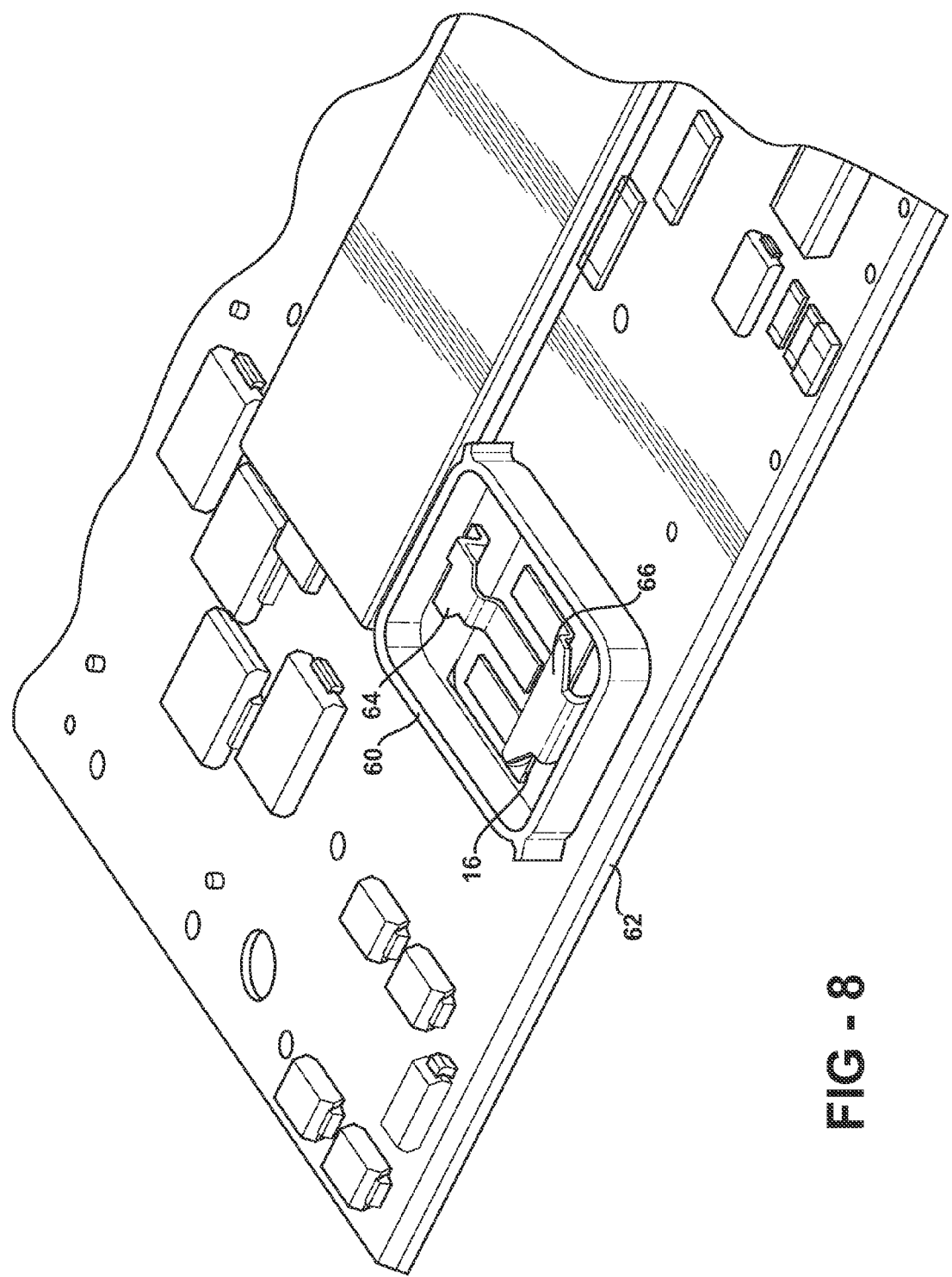
FIG. 8 is a partial, perspective view of a second embodiment of the invention wherein a switching assembly is surface mounted directly onto a circuit board and then potted in place.

The completed switching assembly 10 can be attached to a circuit board and soldered in circuit using conventional techniques. However, in addition to potting the switching assembly 10 into a package for use as a discrete component that is subsequently soldered to a circuit board via the terminals extensions 34, 36, 42, the configuration of the switch die 16 allows for it to be directly mounted onto a circuit board as a surface mount device by soldering of the anode directly to a pad on the circuit board and then using lead terminals to connect the gate pad 22 and cathode pads 24 to surface pads on the circuit board. This is shown in FIG. 8. A sealing ring 60 made from, for example plastic, can be placed on the circuit board 62 around the switch die 16 and lead terminals 64, 66, and then potting material poured into the sealing ring to fully embed the switch die and lead terminals in the potting material directly on the circuit board. As with other components on the circuit board, the switching die can be placed and soldered in an automated fashion using, for example, a pick and place machine.

In any of the embodiments, potting of the components can be carried out using potting material that has a low coefficient of thermal expansion so as to closely match the properties of the switch die 16. For example, commercially available potting materials such as Henkel Hysol™ FP4651 and Hysol™ FP4450LV can be used for this purpose.

The switching assembly 10 can be used in a variety of high voltage applications for which low leakage current is desirable. For example, it is useful in aircraft ignition systems, such as capacitive discharge ignition systems for aircraft turbine engines. The use of the illustrated lead terminals for all connections to the switch die, rather than via wire bonding, is believed to contribute to the ability of the switching assembly to exhibit very high current switching rates (di/dt) by providing very low inductance connections to the switch die. The lead terminals and extensions used in lead frame 26, as well as the lead terminals shown in FIG. 8 can be made using conventional stamping and/or other metal forming techniques.

Figure 2:
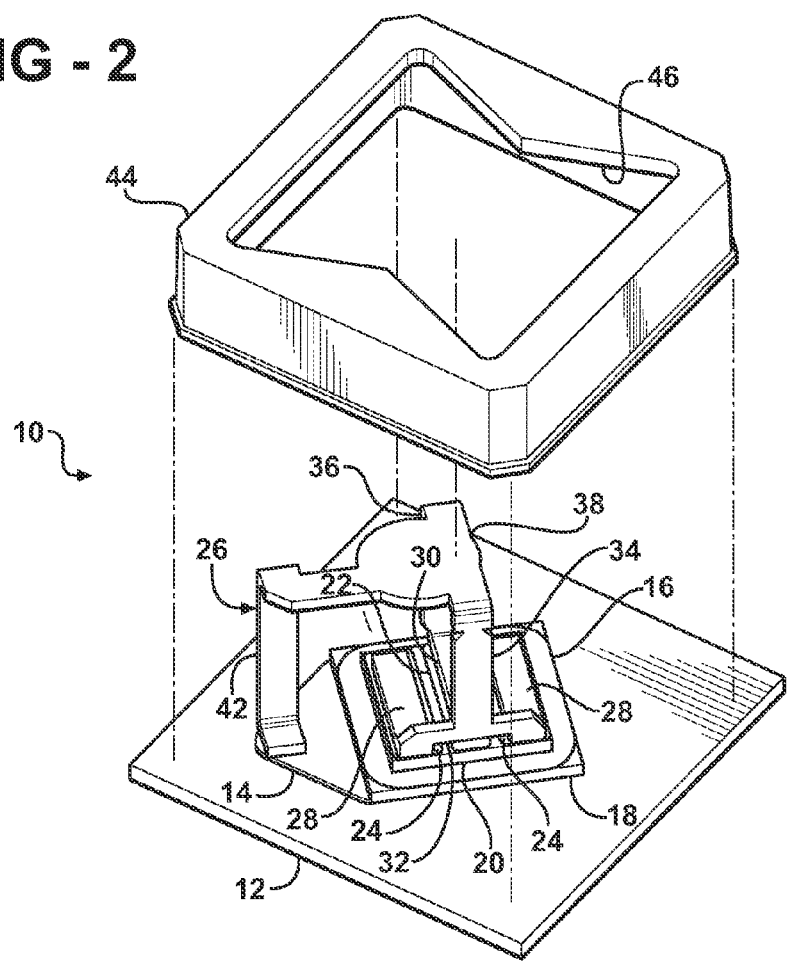
FIG. 2 is a perspective view of the switching assembly of FIG. 1 in a partially assembled condition.
Figure 2A:
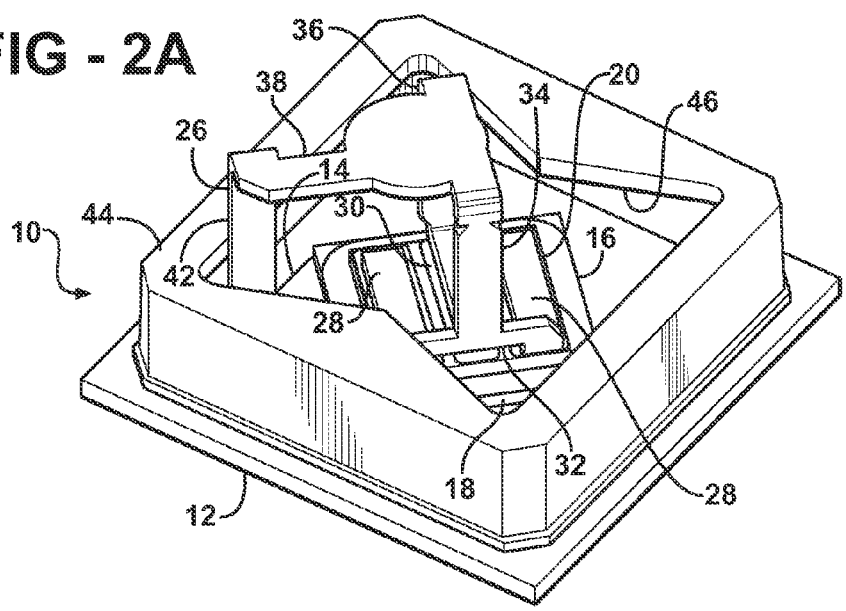
FIG. 2a is a perspective view of the switching assembly of FIG. 1 prior to potting of the components of the assembly.

It is to be understood that the foregoing description is not a definition of the invention, but is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. For example, rather than using a copper pad 14 bonded to the ceramic 12, a metal paste can be screened onto the ceramic which is then oven cured. The switch die 16 can then be soldered onto this cured paste using common soldering techniques. As another example, the outer dimensions of the potting shell 44 can be the same as that of the substrate 12 so that the finished component does not have the visible lower lip as shown in FIG. 2A. As yet another example, the leads 34, 36, and 42 shown in FIGS. 1-4 can be oriented in line with each other rather than in the triangular configuration shown. Also, although the illustrated embodiment uses the ceramic cap 21 with its respective gate and cathode pads 22, 24 for connection to the lead frame 26, it will be appreciated that in some embodiments, this ceramic cap can be eliminated with wire bonding used to connect between external component leads (like leads 34, 36, and 42) and the gates 50 and cathodes 52 of the semiconductor device 20. Where wire bonding is used, multiple bonded wires can be used to maintain a sufficiently low inductance as needed for a particular application. All such other embodiments, changes, and modifications are intended to come within the scope of the appended claims.

As used in this specification and claims, the terms "for example," "for instance," and "such as," and the verbs "comprising," "having," "including," and their other verb forms, when used in conjunction with a listing of one or more components or other items, are each to be construed as open-ended, meaning that that the listing is not to be considered as excluding other, additional components or items. Other terms are to be construed using their broadest reasonable meaning unless they are used in a context that requires a different interpretation.

The invention claimed is:

1. A switching assembly for a high voltage aircraft ignition system, said switching assembly comprising:

a substrate;

an anode pad;

a semiconductor device connected to said anode pad and being supported by said substrate, said semiconductor device having one or more high voltage gates and one or more high voltage cathodes;

at least one gate pad disposed on a surface of said semiconductor device for electrical interconnection to said gate(s) of said semiconductor device;

at least one cathode pad on the surface of said semiconductor device for electrical connection to said cathode(s) of said semiconductor device;

a plurality of leads including a first lead electrically connected directly to said gate pad at said surface of said semiconductor device, a second lead electrically connected directly to said cathode pad at said surface of said semiconductor device, and a third lead electrically connected to said anode pad; and potting covering said gate, cathode, and anode pads and covering a portion of said leads, such that said leads extend out of said potting to an exposed location for external connections to said switching assembly.

2. A switching assembly as set forth in claim 1, wherein said at least one cathode pad comprises a pair of cathode pads both directly connected to said second lead, and wherein said gate pad comprises a single gate pad positioned on said semiconductor device between said pair of gate pads.

3. A switching assembly as set forth in claim 2, wherein said anode pad is located at a bottom side of said semiconductor device, said gate and cathode pads are located at a top side of said semiconductor device, and said leads extend upwardly above and away from said top side.

4. A switching assembly as set forth in claim 1, wherein said semiconductor device comprises a switch die that includes said semiconductor device having said anode pad bonded to a backside of the semiconductor device, and having a ceramic cap mounted on top of said semiconductor device, wherein said gate pad and cathode pad are mounted on top of said ceramic cap such that said ceramic cap is positioned between said semiconductor device and said gate and cathode pads.

5. A switching assembly as set forth in claim 4, wherein said cathode pad is a first cathode pad, and wherein said ceramic cap further includes a second cathode pad.

6. A switching assembly as set forth in claim 4 further comprising welding points extending through said ceramic cap from said cathode(s) to said cathode pad.

7. A switching assembly as set forth in claim 1, wherein said substrate is a ceramic substrate having an electrical pad on a top surface of said substrate, and wherein said anode pad is bonded to said semiconductor device and soldered to said electrical pad, and wherein said third lead is soldered to said electrical pad.

8. A switching assembly for a high voltage aircraft ignition system, said switching assembly comprising:

a ceramic substrate;

an anode pad bonded to said ceramic substrate;

a switch die having a semiconductor frame that includes a plurality of gates and a plurality of cathodes;

a gate pad disposed on a surface of said switch die and electrically connected to said plurality of gates;

a cathode pad disposed on a surface of said switch die and electrically connected to said plurality of cathodes; and a lead frame comprising a plurality of externally exposed leads including a first lead soldered to said gate pad at said surface of said switch die, a second lead soldered to said cathode pad at said surface of said switch die, and a third lead connected to said anode pad to facilitate electrical connection of said switching assembly with the high voltage aircraft ignition system.

9. A switching assembly as set forth in claim 8, wherein said plurality of gates are secured within said switch die.

10. A switching assembly as set forth in claim 9, wherein said plurality of cathodes are secured within said switch die.

11. A switching assembly as set forth in claim 10, wherein each of said plurality of cathodes is disposed adjacent two of said plurality of gates.

12. A switching assembly as set forth in claim 11, wherein said gates extend in a direction parallel to said cathodes.

13. A switching assembly as set forth in claim 12, wherein said gate pad and said cathode pad extend in a direction perpendicular to said plurality of gates and said plurality of cathodes.

14. A switching assembly as set forth in claim 8, wherein said switch die further comprises a ceramic cap attached to said semiconductor frame above said plurality of gates and cathodes, and wherein said gate pad and said cathode pad are attached to a top surface of said ceramic cap and are connected with the respective gates and cathodes, respectively.

* * * * *

UNITED STATES PATENT AND TRADEMARK OFFICE
CERTIFICATE OF CORRECTION

PATENT NO. : 7,880,281 B2  
APPLICATION NO. : 12/194933  
DATED : February 1, 2011  
INVENTOR(S) : Steve J. Kempinski Page 1 of 1

It is certified that error appears in the above-identified patent and that said Letters Patent is hereby corrected as shown below:

Claim 2, Column 1, Line 21, delete "gate" and insert --cathode--

Signed and Sealed this  
Ninth Day of August, 2011

David J. Kappos  
*Director of the United States Patent and Trademark Office*

UNITED STATES PATENT AND TRADEMARK OFFICE
CERTIFICATE OF CORRECTION

| | | Page 1 of 1 |
|---|---|---|
| PATENT NO. | : 7,880,281 B2 | |
| APPLICATION NO. | : 12/194933 | |
| DATED | : February 1, 2011 | |
| INVENTOR(S) | : Steve J. Kempinski | |

It is certified that error appears in the above-identified patent and that said Letters Patent is hereby corrected as shown below:

Claim 2, Column 5, Line 21, delete "gate" and insert --cathode--

This certificate supersedes the Certificate of Correction issued August 9, 2011.

Signed and Sealed this
Thirtieth Day of August, 2011

David J. Kappos
*Director of the United States Patent and Trademark Office*